(12) United States Patent
Panhofer

(10) Patent No.: US 7,609,075 B2
(45) Date of Patent: Oct. 27, 2009

(54) DIFFERENTIAL LEVEL SHIFTER WITH AUTOMATIC ERROR COMPENSATION

(75) Inventor: Harald Panhofer, Graz (AT)

(73) Assignee: Infineon Technologies AG, Munich (DE)

( * ) Notice: Subject to any disclaimer, the term of this patent is extended or adjusted under 35 U.S.C. 154(b) by 272 days.

(21) Appl. No.: 11/734,560

(22) Filed: Apr. 12, 2007

(65) Prior Publication Data
US 2007/0241763 A1    Oct. 18, 2007

(30) Foreign Application Priority Data
Apr. 12, 2006    (DE) .................. 10 2006 017 239

(51) Int. Cl.
*G01R 27/08*    (2006.01)
(52) U.S. Cl. .................. 324/705; 324/691; 324/713
(58) Field of Classification Search ................ 324/691, 324/705, 713; 327/103
See application file for complete search history.

(56) References Cited

U.S. PATENT DOCUMENTS

| | | | |
|---|---|---|---|
| 5,506,509 A * | 4/1996 | Susak | 324/550 |
| 7,049,832 B2 * | 5/2006 | Novak et al. | 324/713 |
| 7,449,896 B2 * | 11/2008 | Ochi | 324/713 |
| 2006/0033509 A1 * | 2/2006 | Awaji et al. | 324/705 |

\* cited by examiner

*Primary Examiner*—Vincent Q Nguyen
*Assistant Examiner*—John Zhu
(74) *Attorney, Agent, or Firm*—Eschweiler & Associates, LLC

(57) ABSTRACT

For measuring a voltage difference between two measurement potentials at the input of a voltage converter that can be controlled via a control input, the measurement potentials are shifted by a voltage potential defined by a first pair of impression currents to obtain a first pair of shifted measurement potentials at the output of the voltage converter. Subsequently, the measurement potentials are shifted by a voltage potential defined by a second pair of impression currents different to the first pair to obtain a second pair of shifted measurement potentials. A controller determines measurement phases, in which the first or second pair of measurement potentials, respectively, is determined. An evaluator determines the voltage difference based on the first voltage difference between the first pair of shifted measurement potentials and based on the second voltage difference between the second pair of shifted measurement potentials and outputs the same at the output.

20 Claims, 9 Drawing Sheets

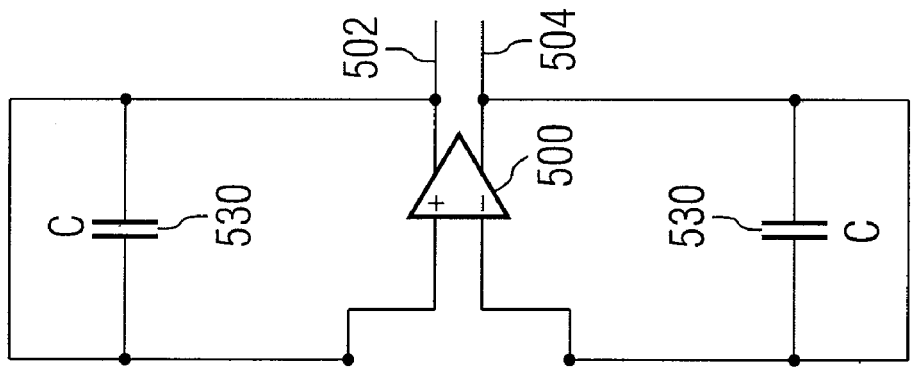
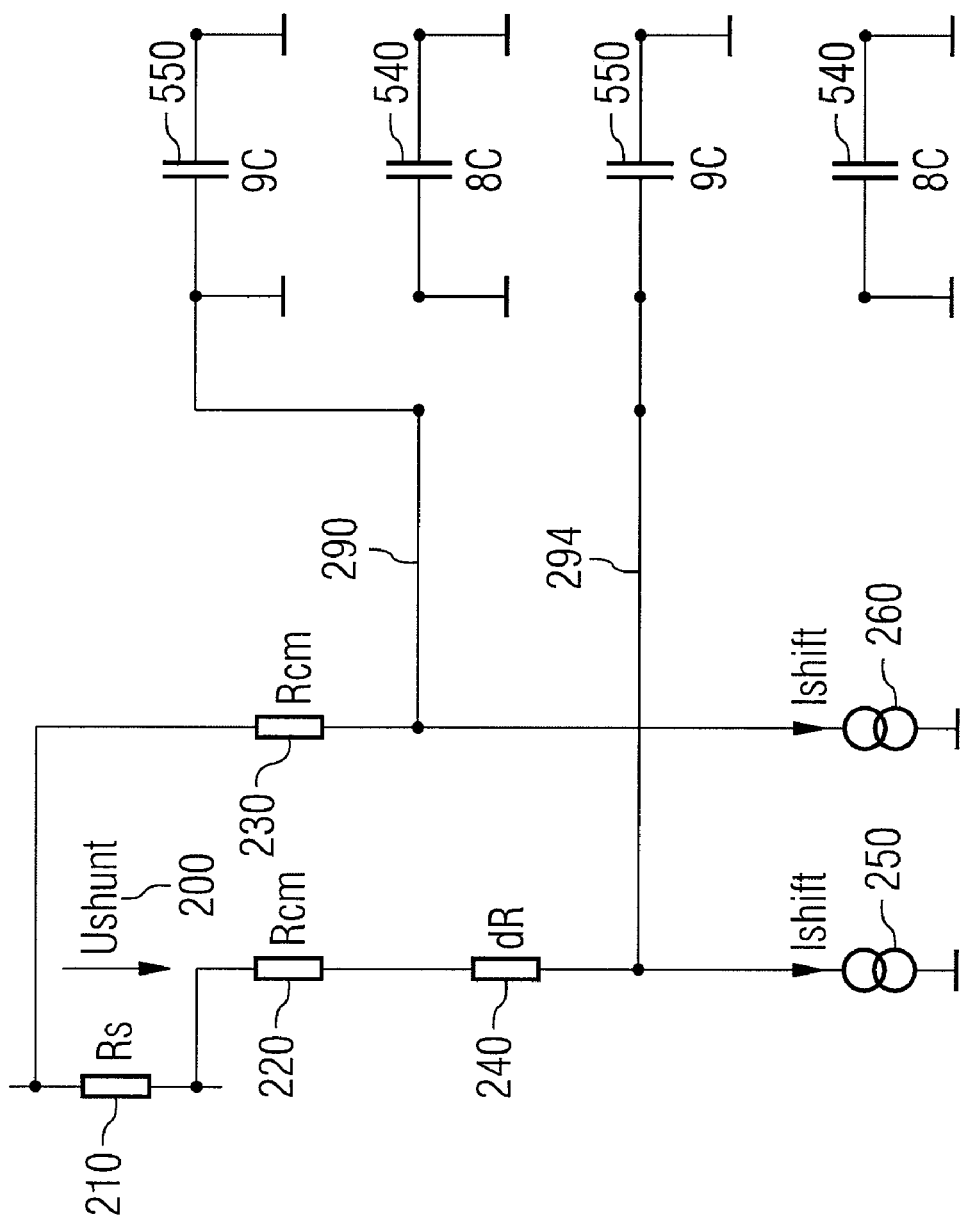
FIG 6

DIFFERENTIAL LEVEL SHIFTER WITH AUTOMATIC ERROR COMPENSATION

CROSS-REFERENCE TO RELATED APPLICATIONS

This application claims priority from German Patent Application No. 102006017239.6, which was filed on Apr. 12, 2006 and is incorporated herein by reference in its entirety.

TECHNICAL FIELD

The present invention relates to the measurement of a voltage difference or an apparatus or circuit, respectively, designed for voltage measurement, as it is used, for example, in voltage measurement at shunt resistors for current measurement in electric motors or magnetic valves.

BACKGROUND

Frequently, clocked systems are used for regulating currents, such as in electric motors or magnetic valves. These systems consist generally of a coil, a power switch, such as a power transistor, and a freewheeling diode, which protects the arrangement from voltage peaks that can occur due to the self-induction of the used coils. Here, the measurement of the coil current represents a large problem. This current measurement is mostly performed via an external or internal shunt resistor. A shunt resistor is a high-precision ohmic resistor, which is connected in series with the arrangement to be measured. In order to obtain a measure for the current through an array, the voltage drop at the shunt resistor is measured. Thus, the voltage measured at the shunt resistor is a direct measure for the current through the whole arrangement. For keeping the power dissipation caused in the shunt resistor as low as possible, the shunt resistances are generally low and lie, for example, between 50 and 200 mOhm. As a consequence, the voltage drop measured at the shunt resistor is also relatively low. The main problems when designing a measurement amplifier are the low voltage drop at the shunt and the high common mode jumps at the input at the amplifier, which can be caused by the self-induction, for example of an electric motor. For example, negative voltages occur at an upstream shunt resistor in the case of a free-running electric motor, wherein in the normal operating case the shunt resistor comes to lie on the battery potential or the supply voltage potential, respectively. In order to compensate these possibly high potential voltages of the voltage difference that can be measured at the shunt resistor, a so-called level shifter is used. A level shifter is an arrangement of resistive elements and current sources, which allows shifting a voltage difference from a first potential to a second potential.

FIG. 8 exemplarily shows such an ideal level shifter. The voltage $U_{shunt}$ 810 is to be measured at the shunt resistor 800 with the resistance $R_s$. Therefore, this voltage is tapped at the shunt resistor 800 and converted to a desired voltage potential via two resistors 820 and 830, each having a resistance of $R_{cm}$, which are fed via two current sources 840 and 850. The voltage at the shunt resistor 800 is then tapped at the current sources 840 and 850 as $U_{shunt}$ 860. In order to not mismatch the voltage $U_{shunt}$ 810, which drops at the shunt resistor 800, it is required that the two resistors 820 and 830 have identical resistances $R_s$. Since actual resistors always have a tolerance, an absolute equality between the resistors 820 and 830 can practically not be obtained.

FIG. 9 shows a further circuit of a level shifter, wherein the resistor difference between the two resistors 820 and 830 is considered as additional resistor 900 with the resistance dR. The resistor difference dR has the consequence that the voltage difference 910, that can now be measured between the two current sources 840 and 850 no longer corresponds to the value $U_{shunt}$ 810, but is mismatched by an additional voltage drop at dR, and thus the voltage $U_{shunt}+dR \cdot I_{shift}$ is measured. Thus, the represented level shifter, which is, for example, used to adjust a steady component of the shunt voltage from the battery potential to an input region of an exact preamplifier, has a mismatch. The accuracy of the circuit is determined by the deviation of the current sources or the resistors, respectively. By trimmed or choppered, respectively, current sources, the deviation of the shift currents then can be reduced, but the resistor deviation remains. For example, for shifting the shunt voltage (which is approximately 200 mV) from $V_{bat}=14$ V to $V_{input}=4$ V, a current of 1 mA and a resistor of 10 kOhm are required. If a resistor tolerance of 0.5% is assumed, this corresponds to 50 Ohm and a voltage mismatch of 50 mV (50 mV=50 Ohm·1 mA). Thus, the error is 50 mV at a maximum signal voltage of 200 mV. For avoiding this problem, high-precision resistors are used, which are represented as 820 and 830 in FIGS. 8 and 9. So-called laser trimming obtains high-precision trimming of ohmic resistors, which is expensive and cost-intensive.

SUMMARY

According to an embodiment, an apparatus for measuring a voltage difference to be measured between two measurement potentials may have a voltage conversion means, which is controllable to shift the measurement potentials by a voltage potential defined by a first pair of impression currents to obtain a first pair of shifted measurement potentials, or to shift the measurement potentials by a voltage potential defined by a pair of impression currents different to the first pair to obtain a second pair of shifted measurement potentials, a control means for controlling the voltage conversion means, such that the voltage conversion means determines the first pair of measurement potentials in a first measurement phase, and determines the second pair of measurement potentials in a second measurement phase; and an evaluation means, which is implemented to determine the voltage difference to be measured based on a first voltage difference between the first pair of shifted measurement potentials and based on a second voltage difference between the second pair of shifted measurement potentials.

BRIEF DESCRIPTION OF THE DRAWINGS

Embodiments will be detailed subsequently referring to the appended drawings, in which:

FIG. 6 is a circuit diagram of a circuit for realizing the measurement apparatus of FIG. 1 according to an embodiment in analog technique during measurement phase 1;

DETAILED DESCRIPTION

According to another embodiment, a method for measuring a voltage difference to be measured between two measurement potentials may have the steps of: shifting the measurement potentials by a voltage potential defined by a first pair of impression currents to obtain a first pair of shifted measurement potentials; shifting the measurement potentials by a voltage potential defined by a second pair of impression currents different to the first pair to obtain a second pair of shifted measurement potentials; and determining the voltage difference to be measured based on a first voltage difference between the first pair of shifted measurement potentials and based on a second voltage difference between the second pair of shifted measurement potentials.

Another embodiment my have a computer program as program code for performing the above-mentioned method when the program runs on a computer.

According to different embodiments, an additional measurement phase with the same level shifter or the same voltage conversion means, respectively, is introduced, while during the second measurement phase, a current different to the current of the first measurement phase is imprinted, so that now two different erroneous voltage differences can be measured, wherein the measurement error can be reduced by combining the two voltage differences. The advantage is that due to the measurement method, no high-precision resistor pairs have to be used in the measurement branches, and thus the expensive and cost-intensive method of laser trimming resistors can be omitted. For example, the different embodiments disclosed are also suitable for non-high-voltage-proof technologies (e.g. CMOS), since a separation of a high-voltage input and a low-voltage amplifier is achieved.

In the following figures the same elements in the individual figures are provided with the same reference numbers, and a repeated description of these elements is omitted.

Figure 1:
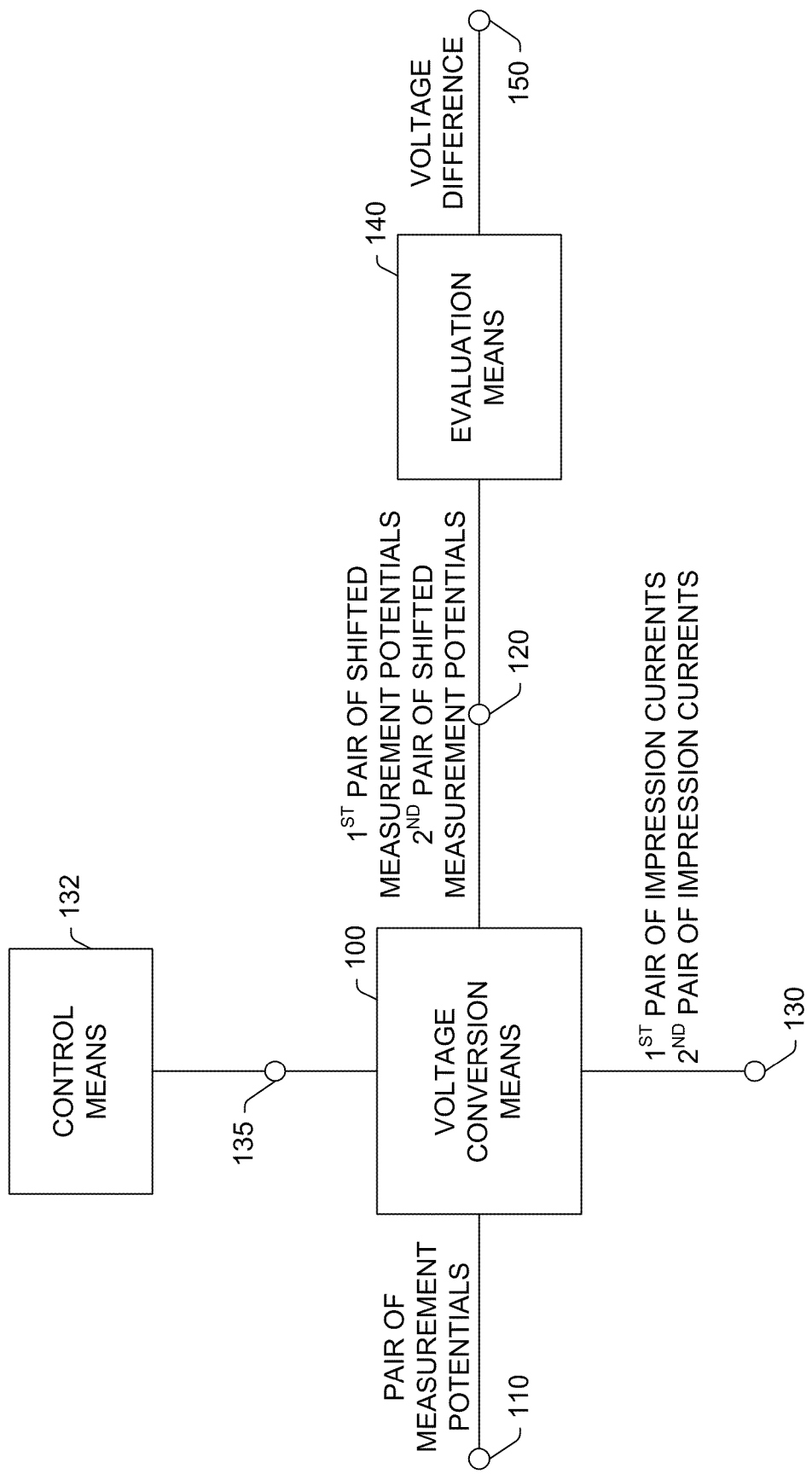
FIG. 1 is a basic block diagram of a measurement apparatus according to an embodiment.

FIG. 1 shows an embodiment of a voltage conversion means 100, at the input 110 of which a pair of measurement potentials is applied, and at the output 120 of which a shifted pair of measurement potentials is output. The voltage conversion means 100 shifts a pair of measurement potentials applied to its input 110 in dependence on a pair of impression currents applied at its control input 130. The shifted pair of measurement potentials is applied at the input 120 of an evaluation means 140. A control means 130 determines successive measurement phases via a control input 135, in which the first or the second pair of shifted measurement potentials is to be determined. The evaluation means 140 determines the voltage difference between the measurement potentials based on the shifted pairs of measurement potentials applied to its input 120. If different pairs of impression currents are applied to the voltage conversion means 100, the same outputs different shifted pairs of measurement potentials. The evaluation means 140 receives these shifted pairs of measurement potentials at its input 120, and determines the voltage difference between the pair of measurement potentials applied to the voltage conversion means 100 from the voltage differences of the shifted pairs, in order to output the same. The evaluation means 140 reduces the influences of possible member tolerances and voltage shifts that have occurred due to the voltage conversion means 100.

Figure 2:
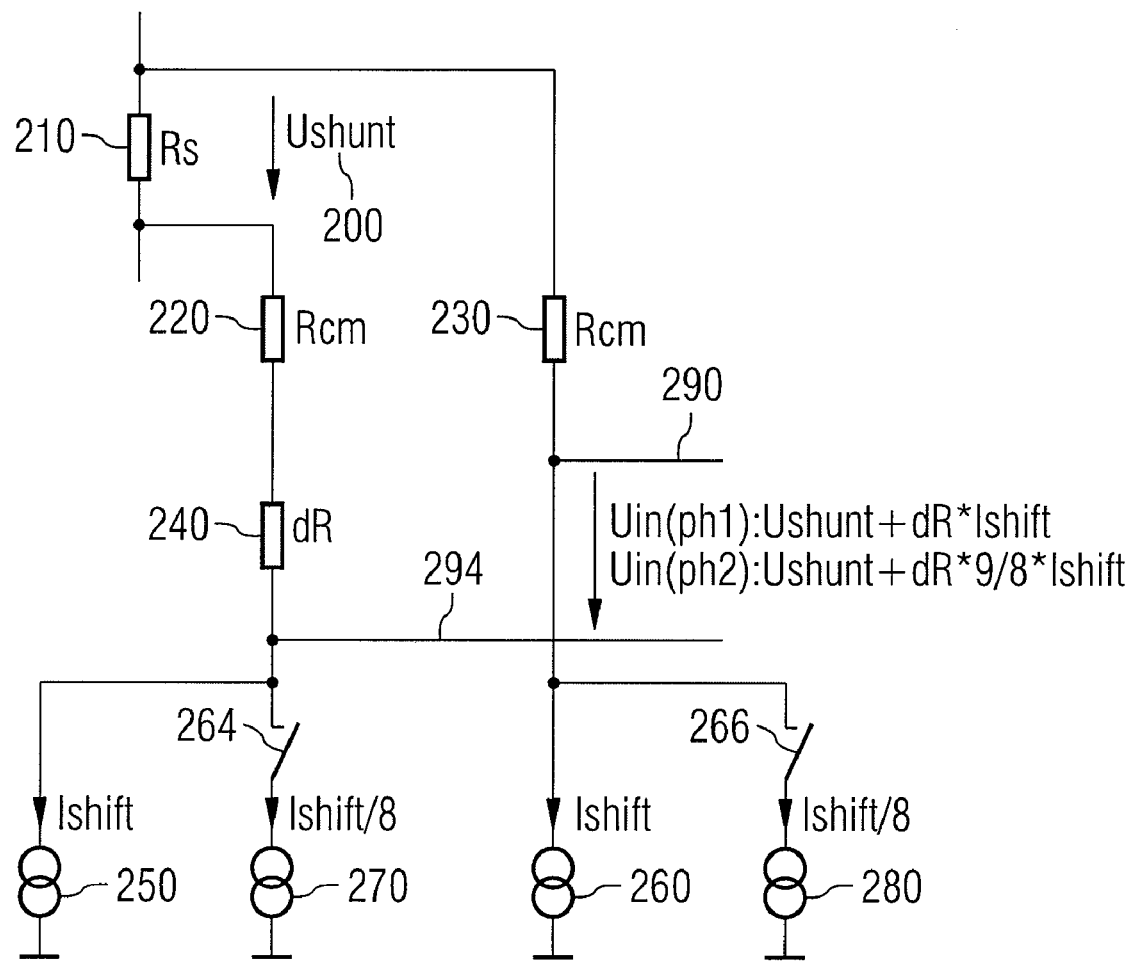
FIG. 2 is a circuit diagram of a circuit for realizing the measurement apparatus of FIG. 1, except the evaluation means according to an embodiment.

One example for a first realization of an embodiment is illustrated in FIG. 2. In FIG. 2, the voltage $U_{shunt}$ across the resistor 210 with the resistance $R_sm$ is brought to a different measurement potential by a level shifter functioning as voltage conversion means. Thereby, the level shifter comprises two measurement branches, each starting from one of the two terminals of the resistor 210, and wherein two equal resistors 220 and 230 are connected each having a resistance of $R_{cm}$, wherein resistor tolerances between the resistors and possible other deviations in the level shifter are illustrated by a third resistor 240 with the resistance dR, which is serially connected into one of the two measurement branches. A current source 250 or 260, respectively, is connected in every measurement branch of the level shifter in a permanent way, wherein the current sources 250 or 260, respectively, provide or generate, respectively, the same current $I_{shift}$. Further, two current sources 270 and 280 that can be switched in can be connected in every measurement branch of the level shifter via switches 264 and 266 in parallel to the current sources 250 or 260, respectively. The current sources 250 or 260, respectively, are implemented to generate a current of $I_{shift}/8$, so that an eighth of the current $I_{shift}$ can be switched-in via the same, respectively. The circuit nodes 290 or 294, respectively, in the two measurement branches between the resistor 220, 240 or 230, respectively, on the one hand, and the parallel circuit of the current sources 250, 270 or 260, 280 on the other hand, form the outputs of the level shifter.

After the structure of the level shifter has been described above, its mode of operation will be described below with reference to FIG. 1. Two measurement phases take place. During measurement phase 1, the current sources 270 and 280 that can be switched in are not switched in, and a voltage $$U_{in}(ph1) = U_{shunt} + dR \cdot I_{shift}$$

is provided at the outputs 290 and 294, which can then be measured by the evaluation means 140 or can be used for evaluation by the same, respectively.

During phase 2, the current sources 270 and 280 that can be switched in, are switched in, so that now the voltage $U_{in}(ph2)$ can be tapped at the outputs 290 or 294, respectively, with:

$$U_{in}(ph2) = U_{shunt} + dR \cdot 9/8 \cdot I_{shift}$$

A change of the voltages provided at the outputs 290 and 294 between the two branches, which depends on the resistor deviation, results between the two measurement phases.

As will become clear from the following embodiments, for determining the voltage $U_{shunt}$ 200 dropping at the resistor 210, the voltage differences $U_{in}(ph1)$ and $U_{in}(ph2)$ are differently amplified by the evaluation means 140 and the results are subtracted from each other. The shunt voltage $U_{shunt}$ results. By simple processing or mathematical conversion, the voltage $U_{shunt}$ can be calculated exactly, wherein the mismatches caused by dR can be reduced or eliminated, respectively.

$$U_{shunt} = 9U_{in}(ph1) - 8U_{in}(ph2)$$

$$= 9U_{shunt} + 9dR \cdot I_{shift} - 8U_{shunt} - 8dR \cdot 9/8 \cdot I_{shift}.$$

Thus, the resistor error of the level shifter is automatically compensated by simultaneously changing the impressed currents, differently amplifying the voltage differences measured in the measurement phases and the difference formation of the amplified measured voltage differences. However, the current ratio $n_1:n_2=9:8$ is only exemplarily and any other ratios of the impressed currents in the two measurement phases can be used, as long as the evaluation means evaluates the measured voltages in correspondence to the current ratios, from:

$$aU_{shunt} = n1 U_{in}(ph1) - n_2 U_{in}(ph2) \quad (2)$$
$$= n_1 U_{shunt} + n_1 dR \cdot I_{shift} - n_2 U_{shunt} - n_2 dR \cdot n_1/n_2 \cdot I_{shift}$$
$$= n_1 U_{shunt} \cdot -n2U_{shunt}$$
$$= (n_1 - n_2) U_{shunt},$$

it follows that $U_{shunt}$ can be determined for any current ratios. The correction factor a has to be considered correspondingly in the evaluation. For $n_2=n_1-1$, a correction factor of $a=1$ results, according to the above presented realization of the embodiment.

Figure 3:
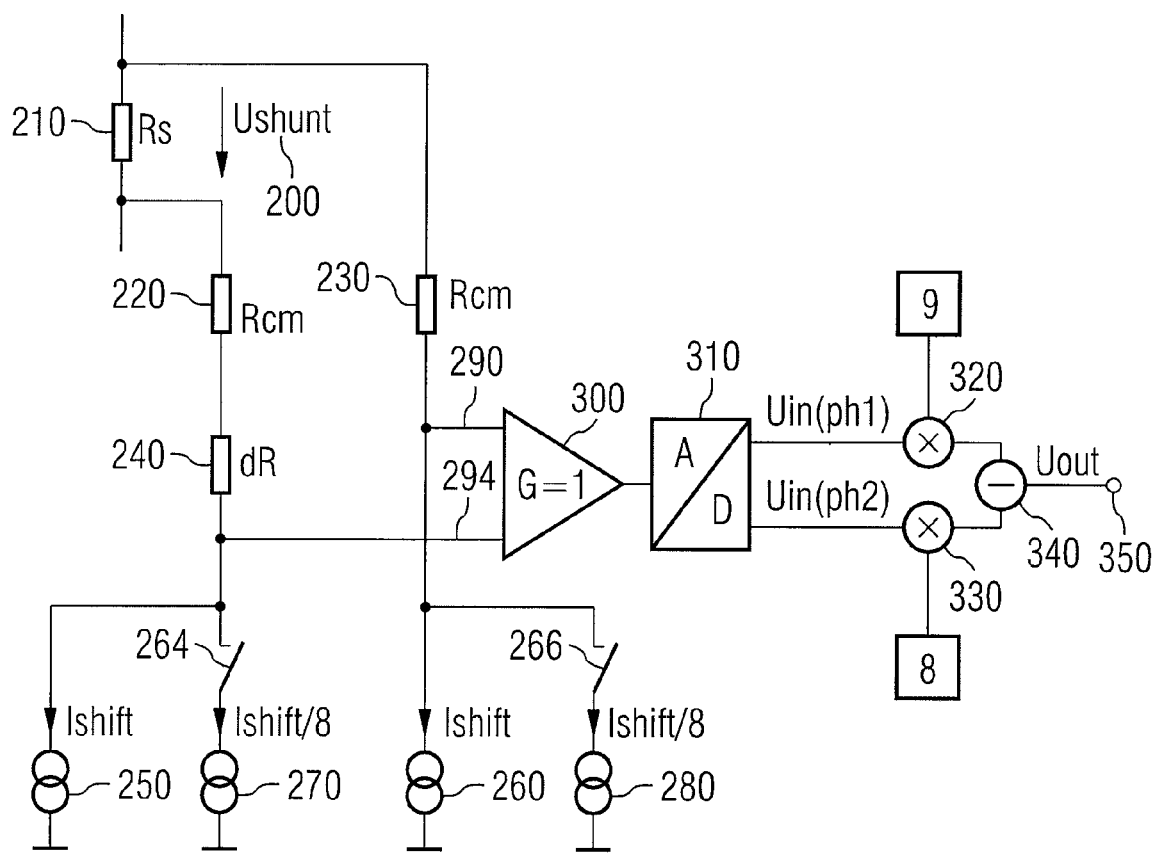
FIG. 3 is a circuit diagram of a circuit for realizing the measurement apparatus of FIG. 1 according to an embodiment.
Figure 4:
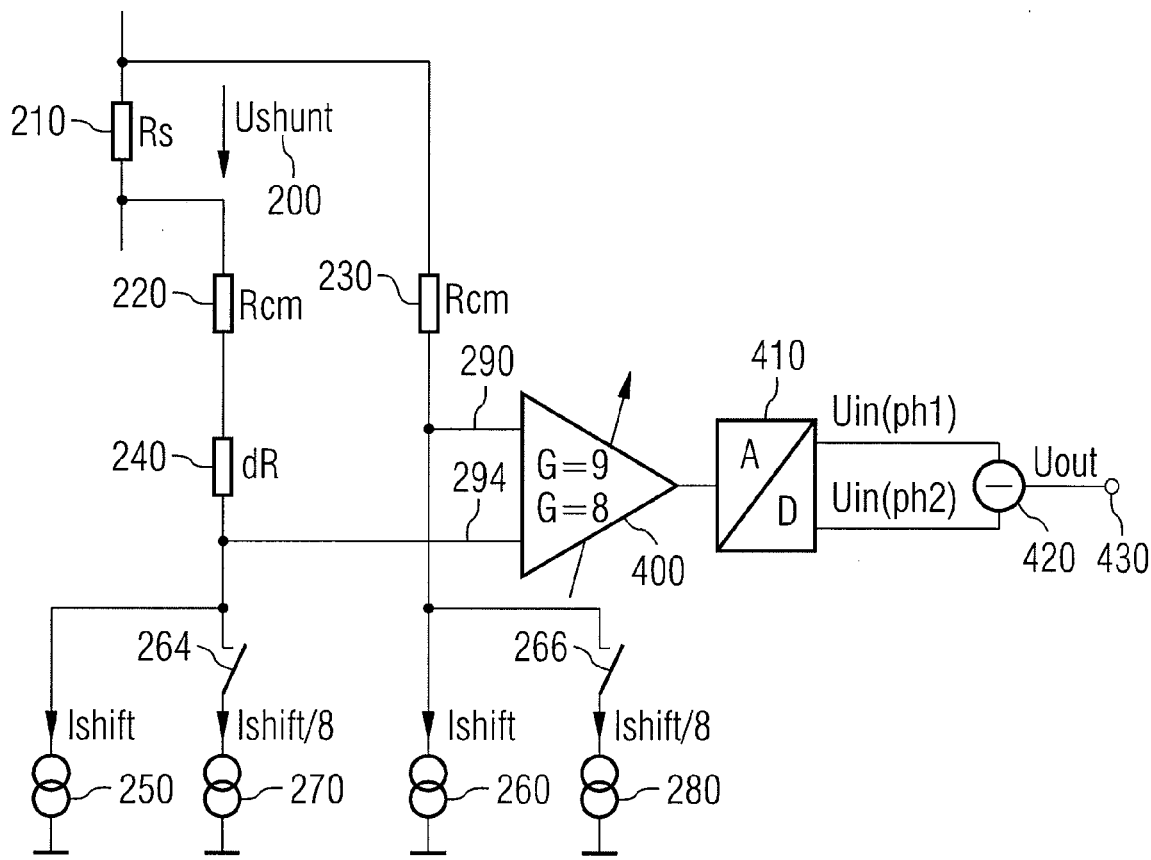
FIG. 4 is a circuit diagram of a circuit for realizing the measurement apparatus of FIG. 1 according to an embodiment having an analog amplifier and subsequent analog/digital converter.
Figure 5:
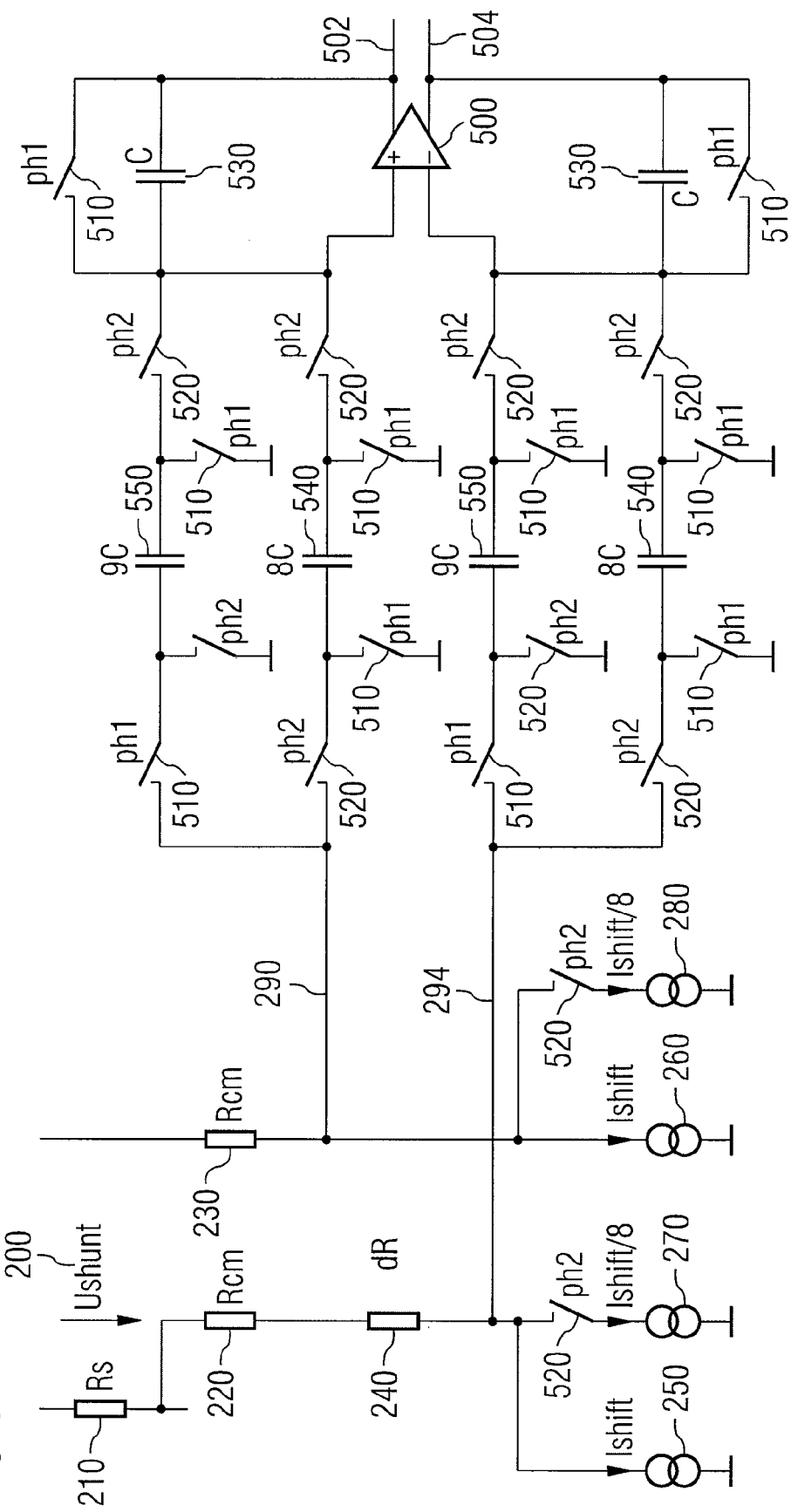
FIG. 5 is a circuit diagram of a circuit for realizing the measurement apparatus of FIG. 1 according to an embodiment in analog technique.

In terms of circuit engineering, the above mathematical conversion can be realized, for example, as illustrated in FIGS. 3, 4 or 5.

FIG. 3 shows an embodiment of a voltage measurement means extended by an embodiment of an evaluation means compared to the structure shown in FIG. 2. The evaluation circuit comprises an operational amplifier 300 with the amplification G=1, an analog/digital converter 310, two digital multipliers 320 and 330 and a digital subtracter 340. A non-inverting input of the operational amplifier 300 is connected to one of the outputs 290 and 294 of the level shifter, while an inverting input of the operational amplifier is connected to other one of the output 290 and 294. One output of the operational amplifier 300 is connected to an input of the analog/digital converter 310. The latter comprises two outputs, each of which is connected to an input of a respective one of the two multipliers 320 or 330, respectively, whose outputs are again connected to two inputs of the subtracter 340. Then, the voltage $U_{out}$ is present at the output of the subtracter 350.

During the measurement phase 1, a first voltage difference $U_{in}(ph1)$ is measured by the operational amplifier 300, and passed on to the analog/digital converter 310 amplified by G=1, respectively, where the same is converted by the analog/digital converter 310 analogously/digitally, and is latched. In the second measurement phase, a second voltage $U_{in}(ph2)$ is measured by the operational amplifier 300 and converted analogously/digitally in the analog/digital converter 310. The stored value of the first measurement phase $U_{in}(ph1)$ and the value $U_{in}(ph2)$ of the second measurement phase is output by the analog/digital converter 310 to the multipliers 320 or 330, respectively. In the digital range, the values are multiplied with the respective amplification factors 8 and 9, which are then subtracted in the subtracter 340 to form the difference indicated in (1). The signal $U_{out}$ reduced by mismatches or cleared of mismatches, respectively, is then output at the output 350 by the subtracter 340. As mentioned above, arbitrary ratios of the impressed currents can be used in the two measurement phases, as long as the amplification factors are correspondingly matched.

An alternative embodiment of FIG. 3 is illustrated in FIG. 4. In addition to the level shifter described in FIG. 2, FIG. 4 shows an analog amplifier 400 as evaluation means, an analog/digital converter 410 and a digital subtracter 420. The output of the operational amplifier 400 is connected to an input of the analog/digital converter 410. The analog/digital converter has again two outputs, one for outputting a latched result and one for outputting the current result. Each of the two outputs of the analog/digital converter 410 is connected to a respective input of the digital subtracter 420, at whose output 430 the voltage $U_{out}$ is present.

During the measurement phase 1, a first voltage difference $U_{in}(ph1)$ is measured by the operational amplifier 400, and passed on to the analog/digital converter 410 amplified by G=9, where the same is analogously/digitally converted by the analog/digital converter 410 and latched. In the second measurement phase, a second voltage $U_{in}(ph2)$ is measured by the operational amplifier 400 and passed on to the analog/digital converter 410 amplified by G=8. The stored value of the first measurement phase $U_{in}(ph1)$ and the value $U_{in}(ph2)$ of the measurement phase are passed on to the subtracter 420 in the digital range by the analog/digital converter 410. The same forms now the difference indicated in (1). The signal $U_{out}$ reduced by mismatches or cleared of the same, respectively, is output at the output 430 by the subtracter 420. Here, any ratios of the impressed currents can be realized in the two measurement phases, as long as the amplification factors are also matched correspondingly.

A technical realization realizing the apparatus of FIG. 1 and particularly the evaluation means in pure analog technique is illustrated in FIG. 5.

Apart from the level shifter already illustrated in FIG. 2, FIG. 5 shows an embodiment of an analog circuit with an operational amplifier 500 having an inverting 502 and a non-inverting output 504 as evaluation means. In the circuit, several switches 510 or 520, respectively, are present, wherein during the first measurement phase 1 the switches ph1 510 are closed and the switches ph2 520 are opened, and during the second measurement phase the switches ph2 520 are closed and the switches ph1 510 are opened. Further, FIG. 5 shows two capacitors 530 each having a capacitance value of C, two capacitors 540 each having a capacitance value of 8C and two capacitors 550 each having a capacitance value of 9C.

Starting from its two outputs 502 or 504, respectively, the operational amplifier 500 is inversely fed-back via two feed-back capacitances 530 each having a capacitance value of C, wherein the two capacitors 530 are short-circuited during the measurement phase 1. During the measurement phase 1, the level shifter is connected to a reference potential (e.g. ground) with its two outputs 290 and 294 via two capacitors 550 with a capacitance value of 9C. The two capacitors 540 with capacitance values of each 8C are short-circuited during the measurement phase 1. During the measurement phase 2, the level shifter is connected to the two inputs of the operational amplifier 500 with its outputs 290 and 294, via one capacitor 540 each having a capacitance value of 8C. The two capacitors 550 with the capacitance values 9C are now reversed in polarity, and connected between the inputs of the operational amplifier 500 and the reference potential.

For simplification, the embodiment of FIG. 5 is illustrated again during the measurement phase 1in FIG. 6 with the corresponding switch positions. It can be seen in FIG. 6 that during the measurement phase 1, the capacitances 550 are each charged to the first two measurement potentials of the outputs of the level shifter 290 or 294, respectively, while all other capacitances 530 and 540 are discharged. Thus, at the end of phase 1, the differential voltage of the outputs 290 and 294 of the level shifters will be stored in the two input capacitances 550.

Figure 7:
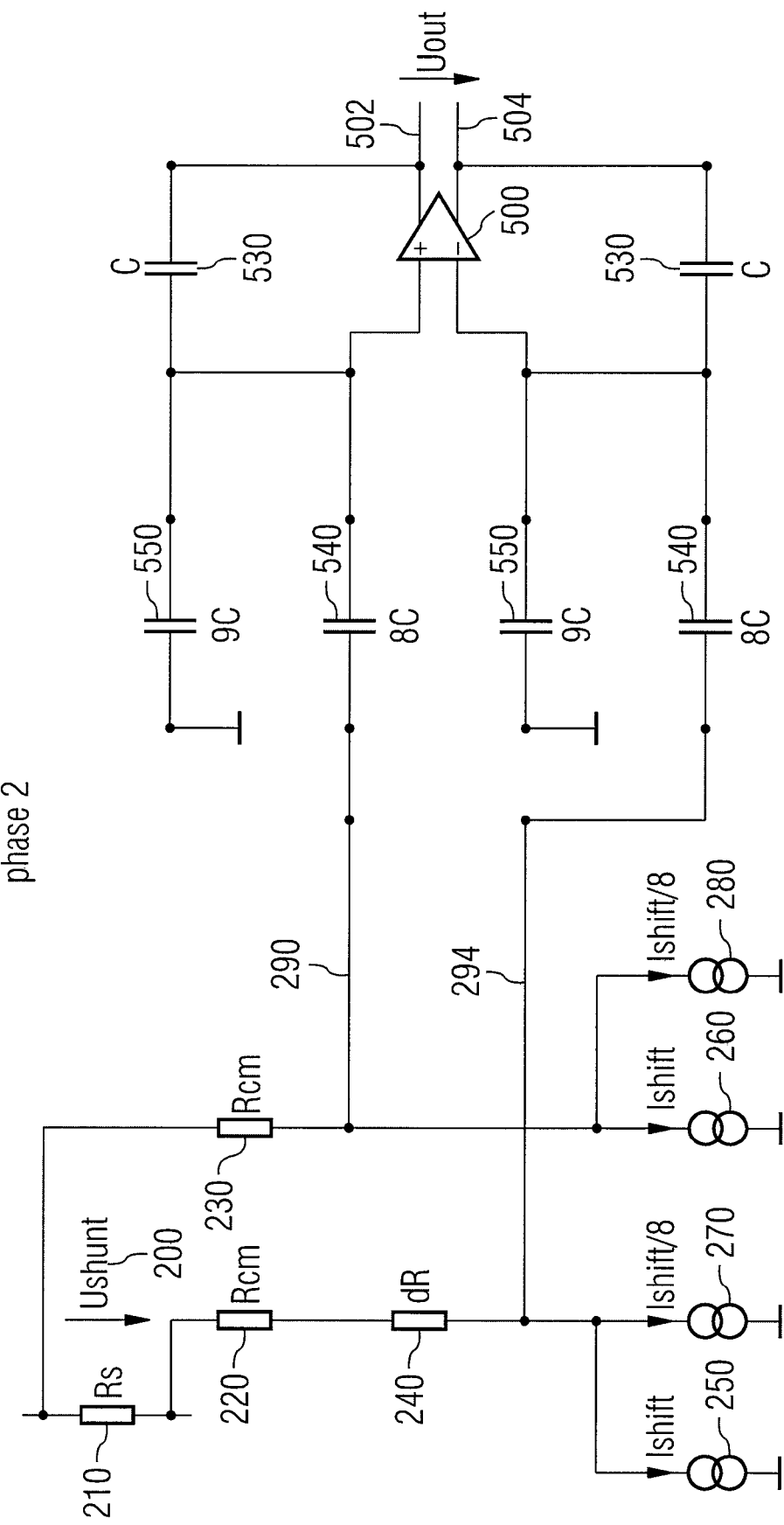
FIG. 7 is a circuit diagram of a circuit for realizing the measurement apparatus of FIG. 1 according to an embodiment in analog technique during measurement phase 2.
Figure 8:
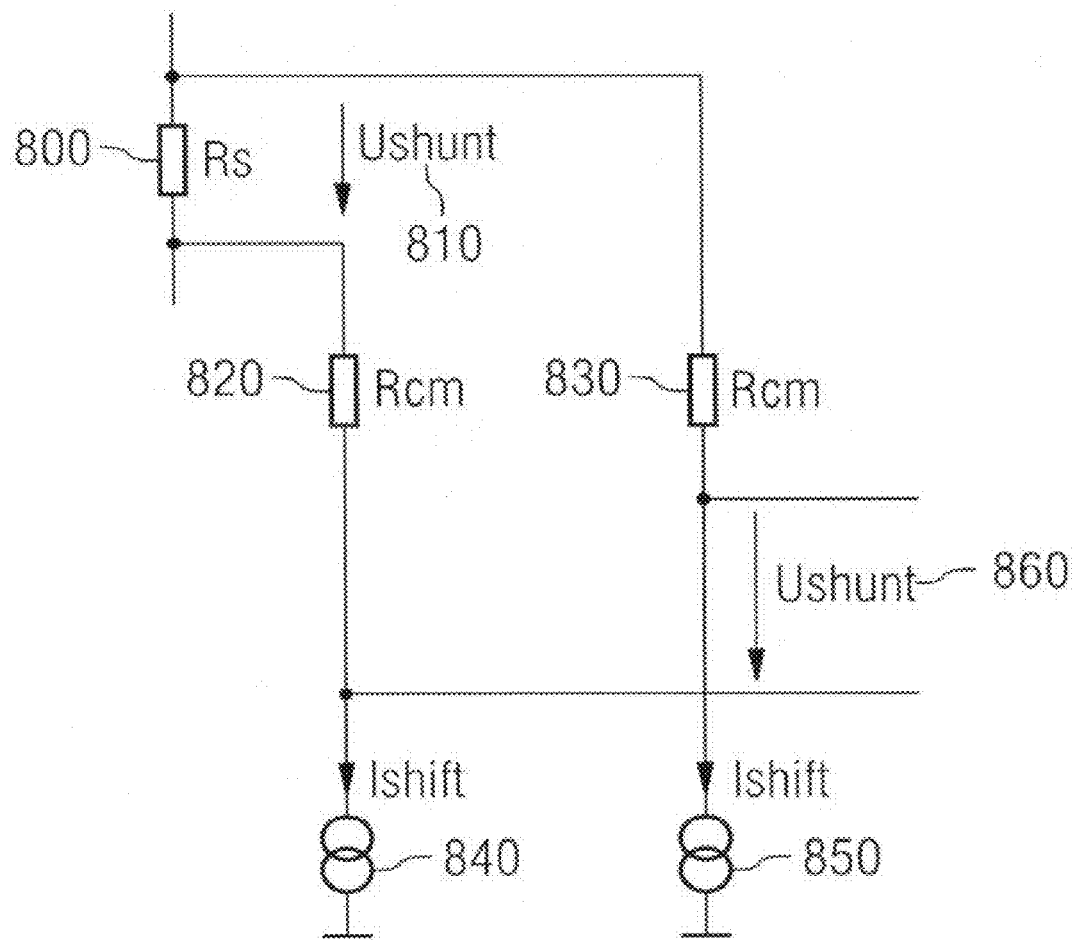
FIG. 8 is a basic circuit diagram of an ideal level shifter.
Figure 9:
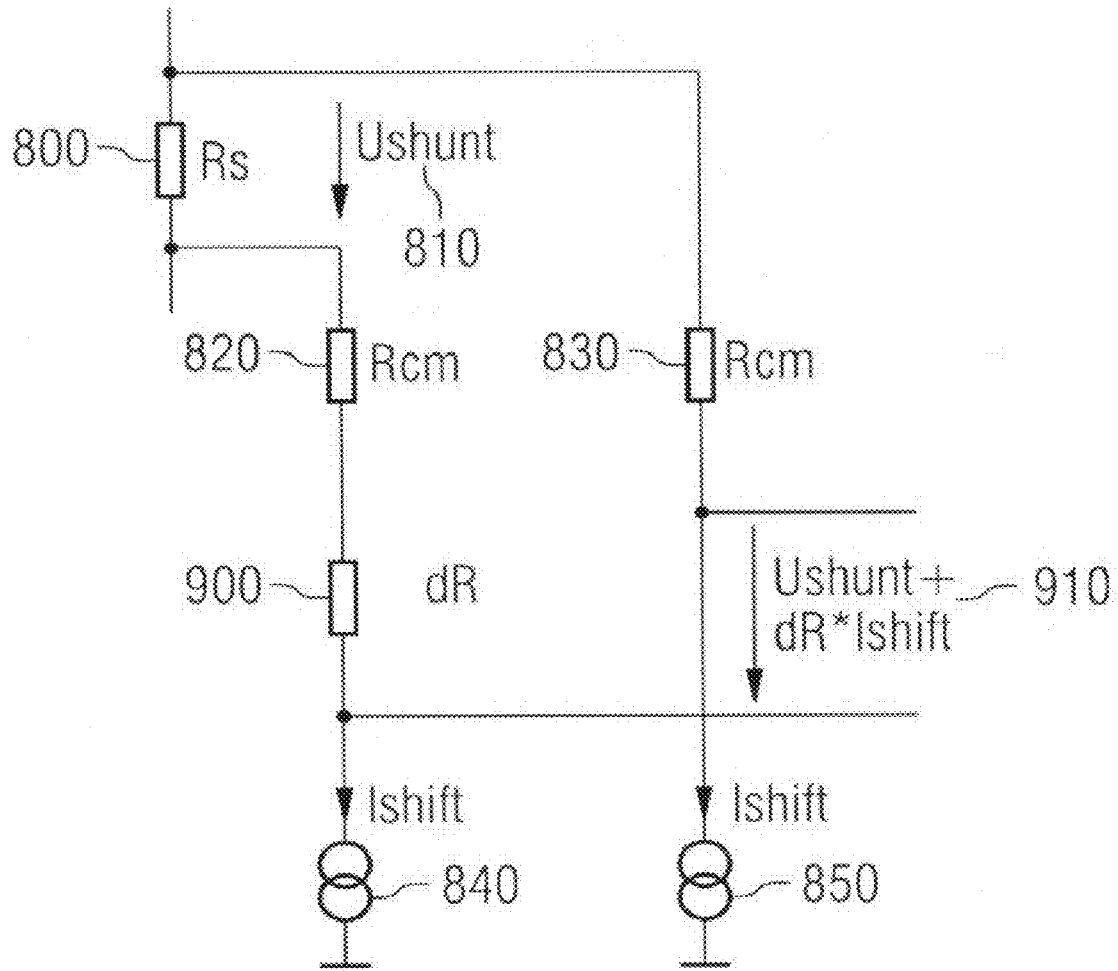
FIG. 9 is a basic circuit diagram of a tolerance level shifter.

FIG. 7 shows the arrangement during the measurement phase 2. During the measurement phase 2, the capacitances 540 are charged to the second shifted measurement potentials at the outputs 290 and 294 of the level shifter. The difference of these measurement potentials is amplified by a factor 8, wherein the amplification factor results by the ratio of the coupling capacity 540 or 550, respectively, to the feedback capacity 530, and subtracted from the residual charge of the measurement potentials stored in measurement phase 1and amplified by the factor 9, since the measurement potentials stored in the two capacitances from the measurement phase 1 are now reversed in polarity. Between the outputs 502 and 504 of the amplifier, the voltage according to (1) results:

$$U_{out=Ushunt}.$$

Any ratios of the impressed currents can be used in the two measurement phases, as long as the amplification factors are also correspondingly matched via the used capacitances.

In summary, it can be said that by separating high-voltage input and low-voltage amplifier, this concept is suitable for non-high-voltage-proof technologies (CMOS), and the expensive and cost-intensive laser trimming of ohmic loads can be omitted. Basically, voltages on any potentials and any impedances can be measured according to the disclosed embodiments which are not limited to measuring a shunt voltage. The elements shown in FIGS. 1-5 can each be integrated together in a chip or the respective embodiments can be made up of discrete devices.

Depending on the circumstances, the measurement method according to the embodiments can be implemented in hardware or in software. The implementation can be made on digital memory media, particularly a disc or CD with electronically readable control signals that can cooperate with a programmable computer system, such that the respective method is performed. Generally, an embodiment may consist thus also in a computer program product with a program code for performing the method according to an embodiment stored on a machine-readable carrier, when the computer program product runs on a computer. In other words, a specific embodiment can be realized as computer program with a program code for performing the method when the computer program runs on a computer.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. An apparatus for measuring a voltage difference between two measurement potentials, comprising:
    a voltage converter, which is controllable to shift the measurement potentials by a voltage potential defined by a first pair of impression currents to obtain a first pair of shifted measurement potentials, and to shift the measurement potentials by a voltage potential defined by a second pair of impression currents different from the first pair to obtain a second pair of shifted measurement potentials,
    a controller for controlling the voltage converter, such that the voltage converter determines the first pair of shifted measurement potentials in a first measurement phase, and determines the second pair of shifted measurement potentials in a second measurement phase; and
    an evaluator, which is implemented to determine the voltage difference to be measured based on a first voltage difference between the first pair of shifted measurement potentials and based on a second voltage difference between the second pair of shifted measurement potentials.

2. The apparatus according to claim 1, wherein the voltage converter comprises first and second measurement branches, wherein the first measurement branch lies between a first tapping point and a reference potential, and the second measurement branch lies between a second tapping point and the reference potential, wherein a first resistive element and a current source are switched in the first measurement branch, and a second resistive element and a second current source are switched in the second measurement branch.

3. The apparatus according to claim 2, wherein the first current source and the second current source are implemented to generate the same currents.

4. The apparatus according to claim 3, wherein the first and/or second current source has a trimmed or chopped current source.

5. The apparatus according to claim 1, wherein the evaluator is implemented to detect the first and second voltage differences, to convert the same analogously/digitally and then to digitally process them further for determining the voltage difference to be measured.

6. The apparatus according to claim 1, wherein the evaluator is implemented to detect the first and second voltage differences, to amplify them analogously, to convert them analogously/digitally and then to digitally process them further.

7. The apparatus according to claim 1, wherein the evaluator is implemented to determine the voltage difference to be measured with a pure analog circuit to obtain the voltage difference to be measured in analog form.

8. The apparatus according to claim 1, wherein the evaluator is implemented to store two shifted measurement potentials of the first and second measurement potential pairs in capacitances.

9. The apparatus according to claim 1, wherein the evaluator has an operational amplifier circuit.

10. The apparatus according to claim 1, wherein the evaluator has an operational amplifier circuit fed back with capacitances.

11. A method for measuring a voltage difference between two measurement potentials, comprising:
    shifting the measurement potentials by a voltage potential defined by a first pair of impression currents to obtain a first pair of shifted measurement potentials;
    shifting the measurement potentials by a voltage potential defined by a second pair of impression currents different to the first pair to obtain a second pair of shifted measurement potentials; and
    determining the voltage difference to be measured based on a first voltage difference between the first pair of shifted measurement potentials and based on a second voltage difference between the second pair of shifted measurement potentials.

12. A computer program product comprising a computer readable medium storing program code, which when executed on a computer performs a method for measuring a voltage difference between two measurement potentials, comprising:
    shifting the measurement potentials by a voltage potential defined by a first pair of impression currents to obtain a first pair of shifted measurement potentials;
    shifting the measurement potentials by a voltage potential defined by a second pair of impression currents different to the first pair to obtain a second pair of shifted measurement potentials; and determining the voltage difference to be measured based on a first voltage difference between the first pair of shifted measurement potentials and based on a second voltage difference between the second pair of shifted measurement potentials.

13. An apparatus for measuring a voltage difference between two measurement potentials, comprising:
a voltage converter shifting the measurement potentials by a voltage potential and generating first and second pairs of shifted measurement potentials,
a controller controlling the voltage converter such that the voltage converter determines the first pair of shifted measurement potentials in a first measurement phase, and determines the second pair of shifted measurement potentials in a second measurement phase; and
an evaluator determining the voltage difference based on a first voltage difference between the first pair of shifted measurement potentials and on a second voltage difference between the second pair of shifted measurement potentials.

14. The apparatus according to claim 13, wherein the measurement potentials are shifted by a first pair of impression currents for said first pair of shifted measurement potentials and by a voltage potential defined by a second pair of impression currents different from the first pair of impression currents to obtain the second pair of shifted measurement potentials.

15. The apparatus according to claim 13, wherein the voltage converter comprises first and second measurement branches, wherein the first measurement branch lies between a first tapping point and a reference potential, and the second measurement branch lies between a second tapping point and the reference potential, wherein a first resistive element and a current source are switched in the first measurement branch, and a second resistive element and a second current source are switched in the second measurement branch.

16. The apparatus according to claim 15, wherein the first current source and the second current source are implemented to generate the same currents.

17. The apparatus according to claim 16, wherein the first and/or second current source has a trimmed or choppered current source.

18. The apparatus according to claim 13, wherein the evaluator is implemented to detect the first and second voltage differences, to convert the same analogously/digitally and then to digitally process them further for determining the voltage difference to be measured.

19. The apparatus according to claim 13, wherein the evaluator is implemented to detect the first and second voltage differences, to amplify them analogously, to convert them analogously/digitally and then to digitally process them further.

20. The apparatus according to claim 13, wherein the evaluator is implemented to determine the voltage difference to be measured with a pure analog circuit to obtain the voltage difference to be measured in analog form.

* * * * *

UNITED STATES PATENT AND TRADEMARK OFFICE
CERTIFICATE OF CORRECTION

PATENT NO.        : 7,609,075 B2
APPLICATION NO.   : 11/734560
DATED             : October 27, 2009
INVENTOR(S)       : Harald Panhofer It is certified that error appears in the above-identified patent and that said Letters Patent is hereby corrected as shown below:

On the title page item (73), change the Assignee's name from "Infineon Technologies AG" to --Infineon Technologies Austria AG--

Signed and Sealed this

Twentieth Day of July, 2010

David J. Kappos
*Director of the United States Patent and Trademark Office*